United States Patent
Loeper

[19]

[11] Patent Number: 6,125,057
[45] Date of Patent: Sep. 26, 2000

[54] SEGMENTED SOURCE MEMORY ARRAY

[75] Inventor: Duane J. Loeper, Spring City, Pa.

[73] Assignee: Lucent Technologies Inc., Murry Hill, N.J.

[21] Appl. No.: 09/337,147

[22] Filed: Jun. 21, 1999

[51] Int. Cl.[7] .................................................. G11C 16/06
[52] U.S. Cl. .............................. 365/185.21; 365/185.25
[58] Field of Search .................... 365/185.13, 185.17, 365/185.21, 185.25, 185.33, 185.01, 185.05

[56] References Cited

U.S. PATENT DOCUMENTS

| | | | |
|---|---|---|---|
| 5,126,808 | 6/1992 | Montalvo et al. | 365/185.33 |
| 5,315,541 | 5/1994 | Harari et al. | 365/185.33 |
| 5,359,571 | 10/1994 | Yu | 365/185.13 |
| 5,699,298 | 12/1997 | Shiau et al. | 365/185.33 |
| 5,844,839 | 12/1998 | Smayling et al. | 365/185.33 |
| 5,959,884 | 9/1999 | Dent | 365/185.33 |
| 5,999,443 | 12/1999 | Ling et al. | 365/185.01 |

*Primary Examiner*—Trong Phan
*Attorney, Agent, or Firm*—Duane, Morris & Heckscher LLP

[57] ABSTRACT

An integrated circuit memory array has a plurality of rows of memory cells. The rows of the memory array are divided into a plurality of words. Each memory cell is in a column of the memory array, and is coupled at an output terminal to a prechargeable column output line for the column. Each memory cell of a given word is coupled at a source terminal to a local source line for the word. The local source line for each word of the memory array is selectively coupleable to ground.

8 Claims, 2 Drawing Sheets

100

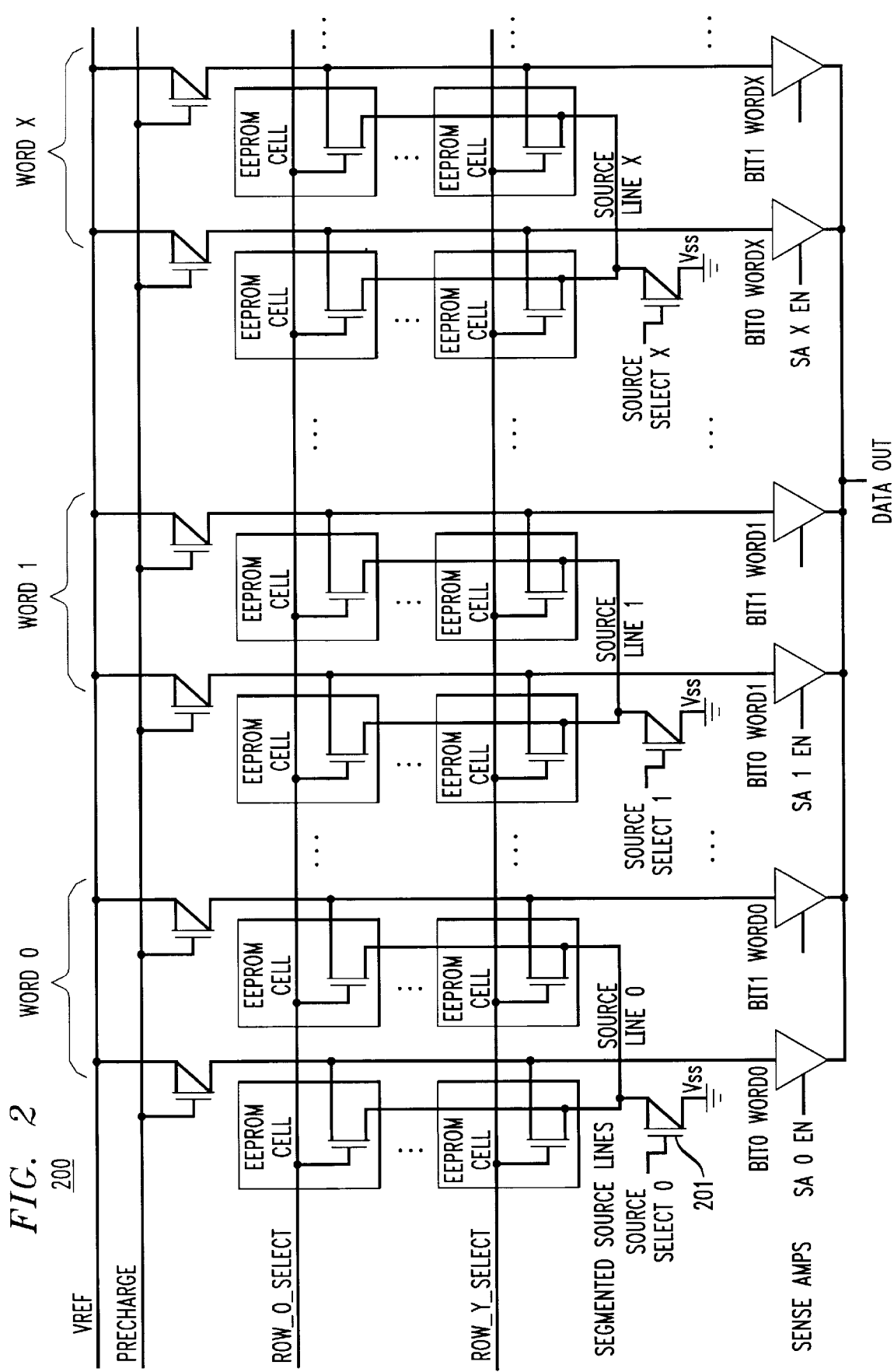

SEGMENTED SOURCE MEMORY ARRAY

BACKGROUND OF THE INVENTION

1. Field of the Invention

The present invention relates to memory devices and, in particular, to precharging the column output lines of a memory cell array before reading a word of the array.

2. Description of the Related Art

Computer memory cells are in wide use today. A memory cell stores a bit of data, i.e. a logic-0 or logic-1, sometimes referred to as low or high, respectively, corresponding to the low voltage state (typically $V_{SS}$, e.g. ground=0V)) or the high voltage state (typically $V_{DD}$, e.g. 3V). New data (i.e., a bit) may be written into the cell, and stored data (i.e., a bit) may be read from the cell. The data stored in a cell is typically read from the cell via an output terminal of the memory cell.

An array of memory cells are typically provided in a memory array architecture, divided into rows and columns. The memory cell array typically provides storage of larger, multi-bit units of data such as bytes or words. Each row of the array usually contains at least one, and typically several, words. Each column of the array typically contains a single column output line which is coupled to every output terminal of the memory cells in that column.

Memory arrays can be implemented in various forms, including Flash EEPROM, DRAM, ROM, and SRAM. Memory arrays are increasingly used in circuits (ICs) in devices such as cellular telephones, answering machines, cordless phones, and other applications. Memory used in ICs in such applications is sometimes referred to as embedded memory.

For some types of memory cells, such as Flash EEPROM, a read operation consists of a pre-period followed by an evaluation period. During the precharge period, all the column output lines of the memory cell array are precharged (initialized), prior to reading the data of the selected word or row, to a certain precharge value (e.g., 1V). During the evaluation period, which follows the precharging, sensing circuitry (e.g. sense amps) can determine the state of an enabled memory cell by detecting whether or not the precharged column output line for that cell discharges or not.

Referring now to FIG. 1, there is shown a circuit diagram illustrating a common-source configured memory array 100. Memory array 100 is a Flash EEPROM memory cell array, although other types of memory cell arrays are also utilized. Each row of array 100 comprises X+1 words, and array 100 comprises Y+1 rows, for a total of (X+1)(Y+1) words. Each word is illustrated for simplicity as having only two memory cells, although in practice each word would contain a larger number of cells (bits), such as 32 or 128, and in any event typically a power of two. Typical values are (Y+1)=512 and (X+1)=16, with 32-bit words, for an 8 k 32-bit memory.

Designs such as array 100 often provide more than one word per row for practical reasons. For example, if there is only one word per row, the array may be very tall and skinny; however, a more square shape may be desirable for layout purposes. In addition, the taller and skinner an array is, for a given word-size array, the more rows there are and thus the more loading there is on each column output line. Thus, many memory cell architectures provide more than one word per row, where "word" refers to the unit of bits that is either written or read simultaneously.

Whenever a given word is to be read, in the precharge period, all the column output lines (denoted by BIT0, BIT1, of each word) are precharged via the PRECHARGE line to high ($V_{DD}$). All the column output lines are precharged since it is not known until the evaluation period (after the address of the word to be read has been provided and decoded) which particular word of which particular row is going to be read. It is only known at this point that some word is going to be read; thus, all column output lines are precharged.

Just before the system or memory clock transitions from high to low to begin the evaluation period, the address of the word is provided to memory control (or decoding) logic, which decodes from the address the row which should be enabled, as well as the particular word of the row that is to be read. This latter determination, in the design illustrated in FIG. 1, determines which of the SA EN (sense amp enable) signals is activated. During the evaluation period, cells of a row are enabled by the row select signal coupled to the gates of the cells switching to high. An enabled cell having its source terminal coupled to ground and its drain terminal coupled to a precharged column output line will conduct if the cell has been erased (stores a logic-0 or low), thereby discharging the column output line via the ground connected common source. Thus, during the evaluation period, a given cell is coupled to the column output line for its column position, and the cell either discharges (to logic-0 ($V_{SS}$)) or does not discharge, depending on whether the cell is low (logic-0) or high (logic-1), respectively.

When a column output line is discharged (when the cell has a logic-0 stored), external circuitry, such as a sense amp coupled to the column output lines, can detect the bit stored in the cell if the sense amp is enabled by the appropriate SA EN signal, by detecting whether or not the column output line to which its input is connected has been discharged or not. The sense amp provides an appropriate-format logic-0 or logic-1 signal at a data output terminal or line in accordance with whether or not the discharge is detected.

Thus, for example, if the first word (word 0) of the first row (row 0) is to be read, the address designating this word, and provided by an external source such as a processor, is received by memory control logic some time before the evaluation period begins (typically just before the evaluation period begins, i.e. at the end of the precharge period). The memory control logic in this example generates a ROW 0 SELECT signal and a SA 0 EN signal, which are applied to the memory cell array 100 throughout the entire evaluation period.

When the clock transitions to low and the evaluation period begins, the ROW 0 SELECT signal provided by the memory control logic causes all memory cells of all X+1 words of row 0 to be enabled, and the SA 0 EN signal enables only the sense amps coupled to the column output lines for word 0. All of the source terminals of all memory cells are coupled to the common source line, which is grounded to $V_{SS}$. Thus, any of the memory cells of row 0, from any of words 0 through X+1, which have a logic-0 stored therein, cause the respective column output line to which the cell's drain (output) terminal is coupled to be discharged to zero through the common source ground connection. However, this discharge or lack of discharge is detected only by the enabled sense amps, i.e. those for word 0. The other sense amps are disabled and ignore any discharge or lack thereof for the other column lines. During the evaluation period, therefore, all of the cells on the selected row which are erased (store logic-0) will discharge their columns, regardless of whether they are associated with the word being read. During the next precharge period, all of the discharged columns have to be recharged again, resulting in a power component that is dependent on the number of cells per row being accessed which are erased.

Thus, because all the column lines of the array are precharged, and because all the memory cells of a given row are enabled and are coupled to a common source line, power is wasted when columns have be re recharged again in subsequent read cycles, because the columns were unnecessarily discharged in the previous read cycle. (In general, if a proper subset of the memory cells of a row are being read, the other memory cells of the row which are not being read can be needlessly precharged and discharged, thus causing power waste.) For example, if word 0 of row 0 is to be read, and bit 0 of word 1 has a zero stored therein, then its associated column output line is first precharged, then discharged, and then must be precharged again for subsequent read operations. This results in a waste of power which can be particularly problematic in battery powered devices such as cellular phones or cordless phones. The worst case is a read operation following an erase of the entire memory array. In this case, every cell of X words of the X+1 words of the enabled row are needlessly discharged, and have to be precharged again before another read. Thus, memory cell arrays which have more than one word per row (or which provide for reads of less than all memory cells of the row), which utilize read operation column output line precharging, and which have a common source line, can inefficiently utilize power in unnecessarily precharging and discharging column output lines of words not being read.

SUMMARY

An integrated circuit memory array has a plurality of rows of memory cells. The rows of the memory array are divided into a plurality of words. Each memory cell is in a column of the memory array, and is coupled at an output terminal to a prechargeable column output line for the column. Each memory cell of a given word is coupled at a source terminal to a local source line for the word. The local source line for each word of the memory array is selectively coupleable to ground.

BRIEF DESCRIPTION OF THE DRAWINGS

FIG. 2 is a circuit diagram illustrating a segmented-source memory array, in accordance with an embodiment of the present invention.

DESCRIPTION OF THE PREFERRED EMBODIMENT

Figure 1:
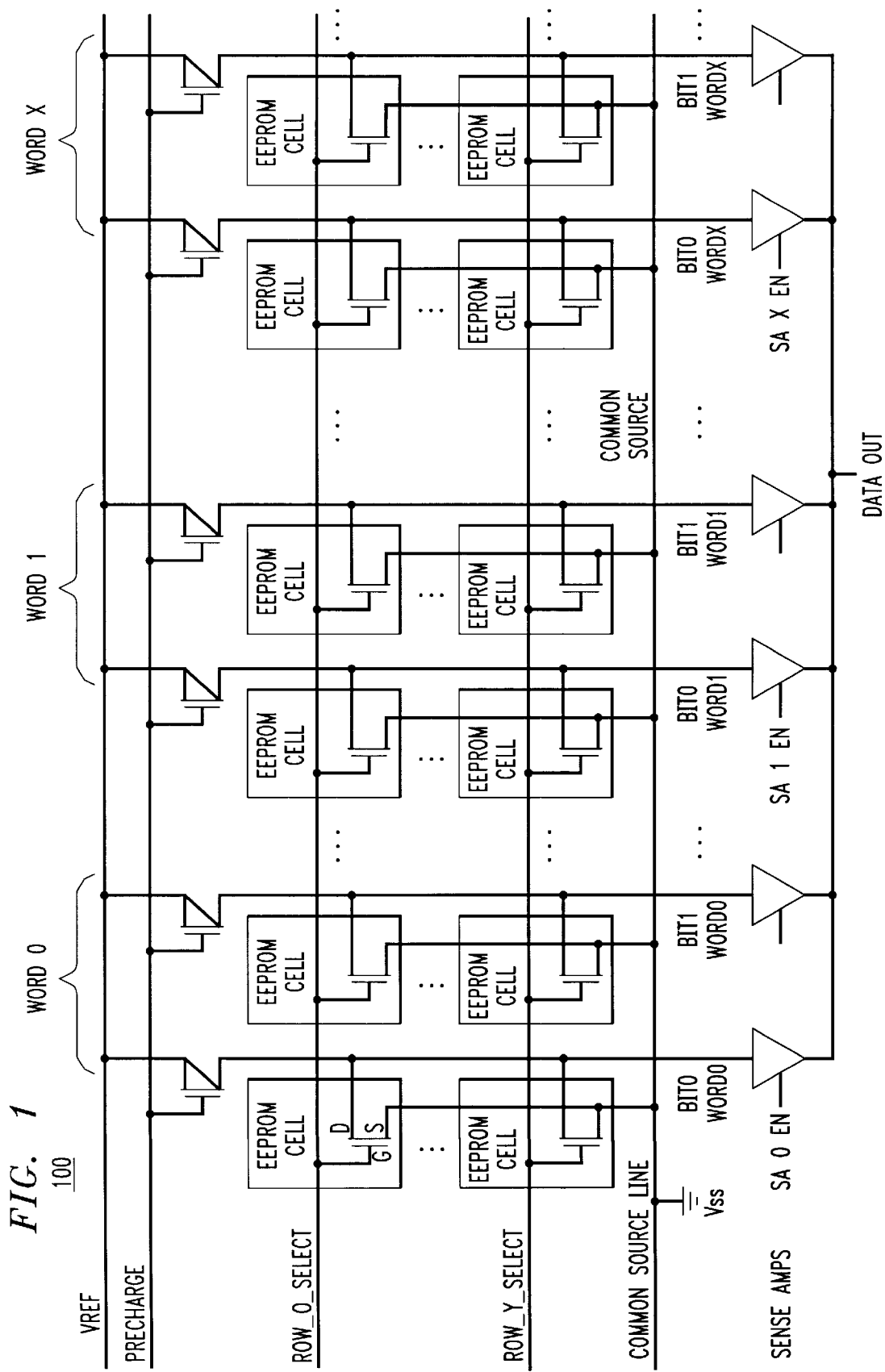
FIG. 1 is a circuit diagram illustrating a common-source configured memory array.

In the present invention, segmented sources are utilized instead of a common source. Each word is coupled to a segmented source line for that word, which source is grounded only if that word is the word position being read. The source is grounded or not by a source select signal derived from the address information, and thus may be provided by the memory control logic. The various SA EN signals or signals derived therefrom may be utilized for this purpose. As described in further detail below, this prevents substantial discharge from words which are not being read. By preventing unnecessary column line discharges, the present invention also prevents power from being wasted by having to recharge these column lines in the next precharge period.

Another solution would be to couple separate precharge lines to the columns for different words of the row of the memory array, and to precharge only the column lines for the word to be accessed. However, the word being read would have to be known ahead of time, i.e. during the precharge period. This technique would therefore require additional address setup time, possibly resulting in a loss of performance. The present invention does not require additional setup time and only requires the provision of X+1 segmented sources instead of a common source. Each segmented (word) source can be driven by a source select signal readily derivable from already-existing sense amp enable (SA EN) signals.

Referring now to FIG. 2, there is shown a circuit diagram illustrating a segmented-source memory array 200, in accordance with an embodiment of the present invention. Memory array 200 is, in one embodiment, implemented as an integrated circuit (IC). In memory array 200, each row contains X+1 words, from word 0 to word X. Thus, row 0 contains word 0 through word X, and the other rows also contain word 0 through word X. In the following discussion, unless the context indicates otherwise, the term "word" refers to the set of words in the same word position in the memory array. Thus, memory array 200 comprises X+1 words, where, for example, word 0 denotes the first word position and encompasses the first word of each of the Y+1 rows. Word 0 of row 0 indicates the memory cells in row 0 that fall in the overall word 0 of the array.

Each word of a given row has a number of cells, each of which has a source terminal coupled to a segmented source line for that word. Thus, word 0 of memory array 200 contains all of the word 0 cells for all of the rows of memory array 200. Each word 0 cell is coupled via its source terminal to a common source line for that word, i.e. source line 0. Each source line is selectively coupleable to ground ($V_{SS}$) via a switching transistor, which is controlled by a unique source select signal. Thus, in memory array 200, the sources for each memory cell of a given word are independently and selectively coupleable to ground. For example, source line 0 is coupled to ground only when the source select 0 signal is high. Thus, in the present invention, each word (i.e., each horizontal word-position) of the memory array is coupled to its own segmented source line, which it selectively coupled to ground. For an array with Y+1 rows and X+1 words, there are X+1 segmented sources, one for each word, rather than a common source for the entire array.

Because each word has a local source line which is selectively coupleable to ground, all other words other than the word being accessed can have their cell source terminals isolated from ground during the evaluation period, thereby preventing any substantial discharge of their column lines. Thus, during the evaluation period, a particular word of a particular row is to be read. This means that only one of the X+1 words is to be accessed during the evaluation period. Each word corresponds to the column output lines for that word. Thus, during the evaluation period, the local source line for the word to be accessed is the only one coupled to ground. All others are not coupled to ground and are thus floating. The column output lines for the accessed word are thus discharged if any of the memory cells in that word position in the enabled row are erased. These discharges or lack thereof may be detected by the (enabled) sense amps for the column output lines for the accessed word.

Any erased memory cells in the enabled row which are in other, non-accessed, word positions, however, are not be able to discharge their column output line because they are coupled at their source terminals to floating local source lines or nodes, not to ground. Thus, during the precharge period of the next read cycle, comparatively little power will be used precharging these column lines since they will have retained most of their charge.

In one embodiment, the SA EN signal for the given word may be utilized as the source select signal for that word. The SA EN signal is available during the evaluation period because it is derived by memory control logic from the address presented just before the beginning of the evaluation period. Because the SA EN signal goes high only for the sense amps couple to the columns of the selected word-position, the same signal may be used to drive the source select signal for that word position. Thus, the SA 0 EN signal, for example, may be coupled directly to the gate terminal of the pull-down device (switching transistor 201) for source line 0.

Thus, in the present invention, the sources of the memory cells are segmented on a word-by-word basis rather than having a common source for all words. The local source line for each word is coupled to the source terminals of all of the memory cells for that word position in all of the rows of the array, and is selectively coupleable to ground via a switch such as pull-down switching transistor 201. Source select signals derivable from address signals and thus available during the evaluation period without extra setup time can be used to drive the various source line switches. The present invention, therefore, advantageously reduces the power used to precharge and discharge the columns of memory cells which are not being read, by Thus, power is conserved with minimal extra layout or complexity, and without requiring additional address setup time.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit having a memory array comprising a plurality of rows of memory cells, wherein:

each memory cell is in a column of the memory array and is coupled at an output terminal to a prechargeable column output line for the column, wherein each column output line is coupled to a sense amp for detecting discharges of its respective column output line;

the rows of the memory array are divided into a plurality of words;

each memory cell of a given word is coupled at a source terminal to a local source line for the word, wherein, during an evaluation period of a read cycle during which a given word of a given row is to be read in accordance with an address, the sense amps associated with the word are enabled by a respective sense amp enable signal provided by memory control logic in response to the address; and the local source line for each word of the memory array is selectively coupleable to ground through a switch which is controlled by the sense amp enable signal for the word to which the local source line belongs.

2. The integrated circuit of claim 1, wherein the memory cells of each row are coupled at their gate terminals to a respective row select line for enabling the memory cells of the row.

3. The integrated circuit of claim 2, wherein:

during a precharge period of the read cycle, each column output line of the memory array is precharged, wherein the read cycle is for reading memory cells of a particular word of a particular row of the memory array in accordance with the address; and during the evaluation period of the read cycle, only the local source line for the word is coupled to ground so that precharged column output lines of other words of the memory array do not discharge when the memory cells for said other words of the row are enabled.

4. The integrated circuit of claim 1, the memory cells of the memory array are Flash EEPROM memory cells.

5. The integrated circuit of claim 1, wherein the output terminal of each memory cell is a drain terminal.

6. An integrated circuit having a memory array comprising a plurality of rows of memory cells, wherein:

each memory cell is in a column of the memory array and is coupled at an output terminal to a prechargeable column output line for the column;

only one memory cell along each row is coupled to the same column output line for the same column;

the rows of the memory array are divided into a plurality of words;

each memory cell of a given word is coupled at a source terminal to a local source line for the word; and the local source line for each word of the memory array is selectively coupleable to ground.

7. An integrated circuit having a memory array comprising a plurality of rows of memory cells, wherein:

each memory cell is in a column of the memory array and is coupled at an output terminal to a prechargeable column output line for the column;

the prechargeable column output lines for all columns are precharged during each read cycle;

the rows of the memory array are divided into a plurality of words;

each memory cell of a given word is coupled at a source terminal to a local source line for the word; and the local source line for each word of the memory array is selectively coupleable to ground.

8. An integrated circuit having a memory array comprising a plurality of rows of memory cells, wherein:

each memory cell is in a column of the memory array and is coupled at an output terminal to a prechargeable column output line for the column;

the prechargeable column output lines for each column are precharged at the end of each read cycle after cell data has been determined;

the rows of the memory array are divided into a plurality of words;

each memory cell of a given word is coupled at a source terminal to a local source line for the word; and the local source line for each word of the memory array is selectively coupleable to ground.

* * * * *